United States Patent
Horiuchi

(10) Patent No.: US 7,940,339 B2
(45) Date of Patent: May 10, 2011

(54) TELEVISION AND STRUCTURE FOR FIXING EARPHONE PLUG SOCKET

(75) Inventor: Yasuo Horiuchi, Osaka (JP)

(73) Assignee: Funai Electric Co., Ltd., Daito-shi, Osaka (JP)

( * ) Notice: Subject to any disclaimer, the term of this patent is extended or adjusted under 35 U.S.C. 154(b) by 1174 days.

(21) Appl. No.: 11/644,251

(22) Filed: Dec. 21, 2006

(65) Prior Publication Data

US 2007/0149007 A1    Jun. 28, 2007

(30) Foreign Application Priority Data

Dec. 26, 2005    (JP) .............................. 2005-010943 U

(51) Int. Cl.
   *H04N 5/64*    (2006.01)
(52) U.S. Cl. ........ 348/836; 381/384; 381/395; 439/374; 312/7.2
(58) Field of Classification Search .................. 381/384, 381/385
See application file for complete search history.

(56) References Cited

U.S. PATENT DOCUMENTS

| | | | | |
|---|---|---|---|---|
| 3,783,321 | A | * | 1/1974 | Patterson ...................... 361/772 |
| 6,865,280 | B2 | * | 3/2005 | Lin ................................ 381/361 |
| 7,031,486 | B2 | * | 4/2006 | Hu ................................. 381/384 |

FOREIGN PATENT DOCUMENTS

| | | |
|---|---|---|
| JP | 1-174883 U | 12/1989 |
| JP | 05-205827 | 8/1993 |
| JP | 7-22580 U | 4/1995 |
| JP | 10-172676 | 6/1998 |
| JP | 2003-282199 | 10/2003 |
| JP | 2005-150004 | 6/2005 |

* cited by examiner

*Primary Examiner* — Jefferey Harold
*Assistant Examiner* — Michael Teitelbaum
(74) *Attorney, Agent, or Firm* — Yokoi & Co.; USA, Inc.; Toshiyuki Yokoi

(57) ABSTRACT

The formation of the retaining member 42 at the forming of the main board 40 so as to be able to be cut off and the cutting-off from the main board 40 after the board forming of the main board 40 causes the retaining member 42 to be separated in a letterpress shape from the main board 40. In addition, on the main board 40, the earphone plug socket 44 is mounted with the plug-in inlet 44b facing the outer periphery, the slit is formed and the projected part 43a of the retaining member 42 is fitted into the slit as well. Further, the fitting of the retaining member 42 into the slit 46 causes the side edge 43b thereof to abut on a groove 44a at the back surface of the earphone plug socket 44.

8 Claims, 6 Drawing Sheets

TELEVISION AND STRUCTURE FOR FIXING EARPHONE PLUG SOCKET

CROSS-REFERENCES TO RELATED APPLICATIONS

The present application is related to the Japanese Utility Model Application No. 2005-10943, filed Dec. 26, 2005, the entire disclosure of which is expressly incorporated by reference herein.

BACKGROUND OF THE INVENTION (1) Field of the Invention

The present invention relates to a television and a structure for fixing an earphone plug socket.

(2) Description of the Related Art

A television is generally provided with an earphone plug socket, which is fixed on a board by solder or the like. The plug-in and pull-out of an earphone by users cause a stress to be imposed backward and forward on the socket, thus leading to solder peeling or a solder crack. This may produce a trouble such as faulty connections. In the past, the addition of a holder as other piece has coped with such troubles in order to reinforce the socket (Refer to Japanese Patent Laid-Open Nos. 2005-150004, H05-205827 and No. H10-172676).

In addition, Japanese Published Unexamined Utility Model Application No. H01-174883 discloses that the protrusion of the cut and raised-up piece of a chassis through the opening of a board and the abutting of the cut and raised-up piece on the back surface of a socket provide the socket with the reinforcement. Also, the related art referred to in Japanese Published Unexamined Utility Model Application No. H01-174883 discloses the abutting of a side edge of another printed circuit board on the back surface of the socket which is disposed in a stacked structure above a printed circuit board.

The soldering of a plurality of pins on the earphone plug socket causes the socket to be fixed on the board. However, since the strength by the soldering only is less reliable for the stress produced by the plug-in and pull-out of a headphone plug, the failure such as pattern peeling is inclined to be generated.

BRIEF SUMMARY OF THE INVENTION

The present invention discloses an earphone plug socket structure in which the improvement in the strength for fixing the earphone plug socket on a board with respect to the stress at the plug insertion can be obtained without adding any new material part.

One aspect of the present invention provides a structure for fixing an earphone plug socket comprising a board on which the earphone plug socket is mounted with the plug-in inlet facing the outer periphery, a retaining member which is formed on a base material of the board and cut off from the board after the forming of the board to be thereby separated in a letterpress shape from the board, a slit formed on the board which the retaining member is fit into to be fixed, a projected part of the retaining member fit into the aforementioned slit and a side edge of the retaining member abutting on the back surface of the earphone plug socket.

In brief, the retaining member is formed so as to be able to be cut off at the forming of the board and the cutting from the board after the board forming causes the retaining member to be thereby separated in a letterpress shape from the board. Also, on the board, the earphone plug socket is mounted with the plug-in inlet facing the outer periphery, the slit is formed and the projected part of the retaining member is fitted into the slit as well. In addition, the fitting of the retaining member into the slit causes the side edge thereof to abut on the back surface of the earphone plug socket.

In the present invention as configured above, since the retaining member supports the back surface of the earphone plug socket even if the stress is imposed on the earphone plug socket in the direction of the plug insertion, the solder peeling hardly occurs in the contact portion between the earphone plug socket and the board. In addition, the diversion of a part of the board as the retaining member eliminates the addition of a new material part and can keep the costs down.

An optional aspect of the present invention provides a structure for fixing an earphone plug socket, wherein the width dimension of the projected part is made long enough to be press-fitted into the slit.

In brief, the width dimension of the projected part is made a little longer than the length of the slit so that the projected part can be press-fitted into the slit.

In the present invention as configured above, since the retaining member can be press-fitted into the slit, the retaining member can be firmly fixed on the board and the earphone plug socket can be held more securely.

Another optional aspect of the present invention provides a structure for fixing an earphone plug socket, wherein a groove engaging with the side edge is formed on the earphone plug socket.

In brief, the side edge of the retaining member contacts the groove to support the back surface of the earphone plug socket.

In the present invention as configured above, the engagement of the side edge of the retaining member with the groove formed on the back surface of the earphone plug socket causes the stress imposed on the earphone plug socket to be directly transmitted to the retaining member, thereby allowing the retaining member to easily support the earphone plug socket.

Another optional aspect of the present invention provides a structure for fixing an earphone plug socket, wherein the projected part is secured on the board by dip soldering.

In brief, with respect to the retaining member, the projected part is not only press-fitted but also fixed on the board by dip soldering.

In the present invention as configured above, the fixing of the retaining member on the board by dip soldering permits the earphone plug socket to be held more securely.

Another aspect of the present invention provides a television comprising: a cathode-ray tube displaying a visible image on the screen; a speaker outputting audio; an earphone plug socket outputting a signal of audio; a main board which receives a television broadcasting to display the visible image on the cathode-ray tube and output the audio through the speaker as well, and the earphone plug socket is mounted on with the plug-in inlet facing the outer periphery; and a plastic cabinet which contains the cathode-ray tube, the speaker and the main board and on the front side of which a hole for exposing the plug-in inlet of the earphone plug socket is formed as well, the main board including: a retaining member of a letterpress shape a split line of which is formed on a marginal portion without forming any wiring pattern to be separated by the cutting-off from the main board after the forming of the board; a slit which a projected part of the retaining member is inserted into and which is formed at the location where a side edge of a extending portion of the retaining member abuts on a back surface of the earphone plug socket as well; and a groove which is longitudinally formed on the back surface of the earphone plug socket so as to be engaged with the side edge, wherein: a length of the projected part is not shorter than a thickness of the main board and a width dimension is long enough to be press-fitted into the slit; the hole is formed to be of larger dimension than the plug-in inlet and smaller than the outer shape of the earphone plug socket; and the projected part is press-fitted into the slit to be fixed and secured by dip soldering as well.

It is needless to say that such a more concrete structure as thus configured in the present invention works as successfully as each above-mentioned invention.

These and other features, aspects, and advantages of the invention will be apparent to those skilled in the art from the following detailed description of preferred non-limiting exemplary embodiments, taken together with the drawings and the claims that follow.

BRIEF DESCRIPTION OF THE DRAWINGS

It is to be understood that the drawings are to be used for the purposes of exemplary illustration only and not as a definition of the limits of the invention. Throughout the disclosure, the word "exemplary" is used exclusively to mean "serving as an example, instance, or illustration." Any embodiment described as "exemplary" is not necessarily to be construed as preferred or advantageous over other embodiments.

Referring to the drawings in which like reference character(s) present corresponding parts throughout.

DETAILED DESCRIPTION OF THE INVENTION

The detailed description set forth below in connection with the appended drawings is intended as a description of presently preferred embodiments of the invention and is not intended to represent the only forms in which the present invention may be constructed and or utilized.

An embodiment of the present invention will be described according to the following arrangement.

Figure 1:
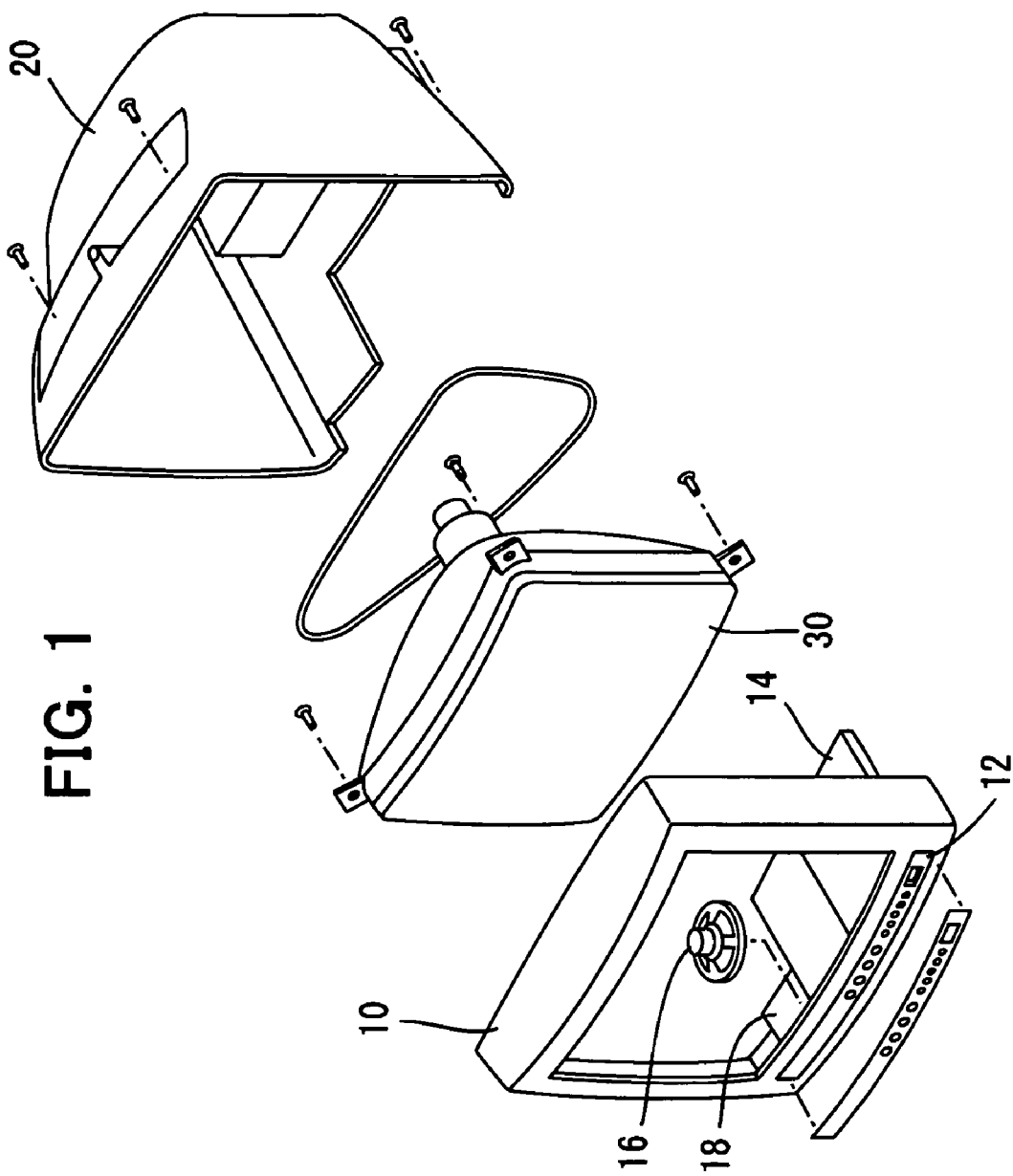
FIG. 1 is an exemplary illustration of a perspective view showing an internal structure of a television according to an embodiment of the invention.

(1) Construction of Television:
(2) Construction of Structure for Fixing Earphone Plug Socket:
(3) Summary:
(1) Construction of Television:

FIG. 1 illustrates an internal arrangement of a television according to an embodiment of the present invention. In the figure, a cabinet of the television is arranged in such a way as a front cabinet 10 facing forward and a back cabinet 20 facing backward are fitted each other. The front cabinet 10 has a rectangular opening for fitting a cathode-ray tube 30 on the front side thereof. The cathode-ray tube 30 is mounted on the front cabinet 10 by screwing at four places. Below the opening of the front cabinet 10 are formed an operation panel 12 provided in general with an electric power switch, operation buttons such as a channel changing, an external input terminal and a plug-in inlet 44b for an earphone.

At the bottom of the front cabinet 10, a bottom plate 14 for mounting a main board 40 and a speaker fitting plate 18 for mounting a speaker 16 are integrally molded with the front cabinet 10. On the bottom plate 14, the main board 40 is almost horizontally installed. In addition, the back cabinet 20 forms a front-open box-like body in which the projected back portion of the cathode-ray tube 30 can be contained.

On the main board 40 are mounted a power circuit generating a power source from a commercial power supply which is required at each unit, a tuner circuit which receives the television radio waves of a designated carrier frequency to generate an intermediate frequency signal, a picture signal processing circuit which takes out a synchronization signal, a color signal and the like from the intermediate frequency signal to produce a picture signal being output to the cathode-ray tube 30, an audio signal processing circuit generating an audio signal from the intermediate frequency signal which can be output to the speaker, an oscillatory circuit generating a pulse signal which is required for driving the cathode-ray tube 30, a flyback transformer generating a high voltage which is required for driving the cathode-ray tube 30, a deflection circuit for deflecting electron beams horizontally and vertically, a microcomputer for controlling each circuit and the like.

Figure 2:
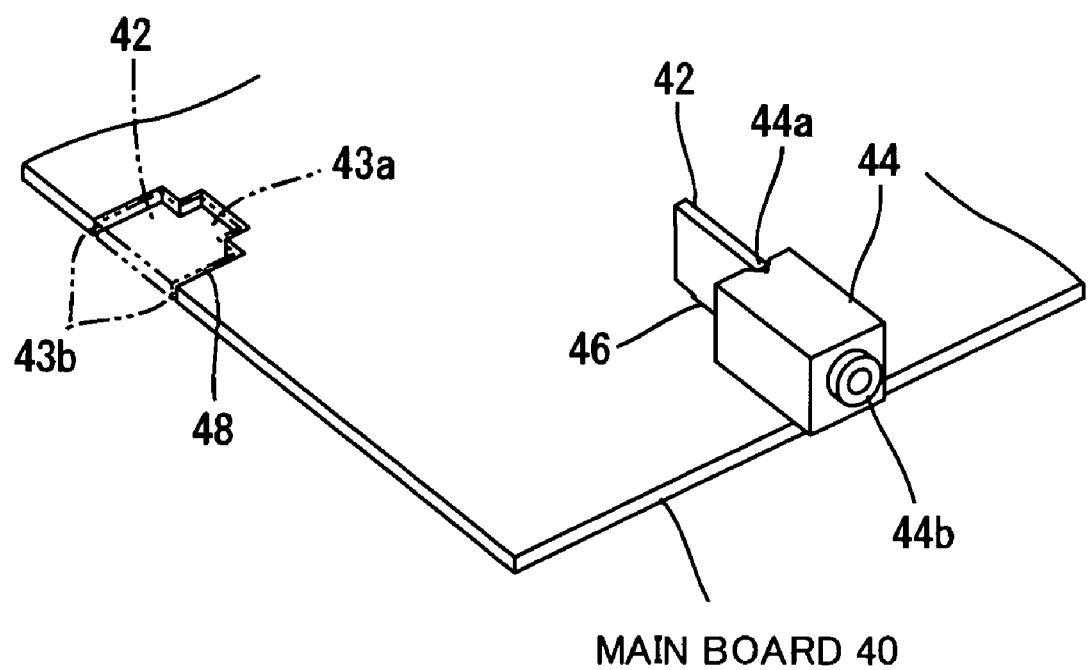
FIG. 2 is an exemplary illustration of a schematic perspective view of a structure for fixing an earphone plug socket.
Figure 3:
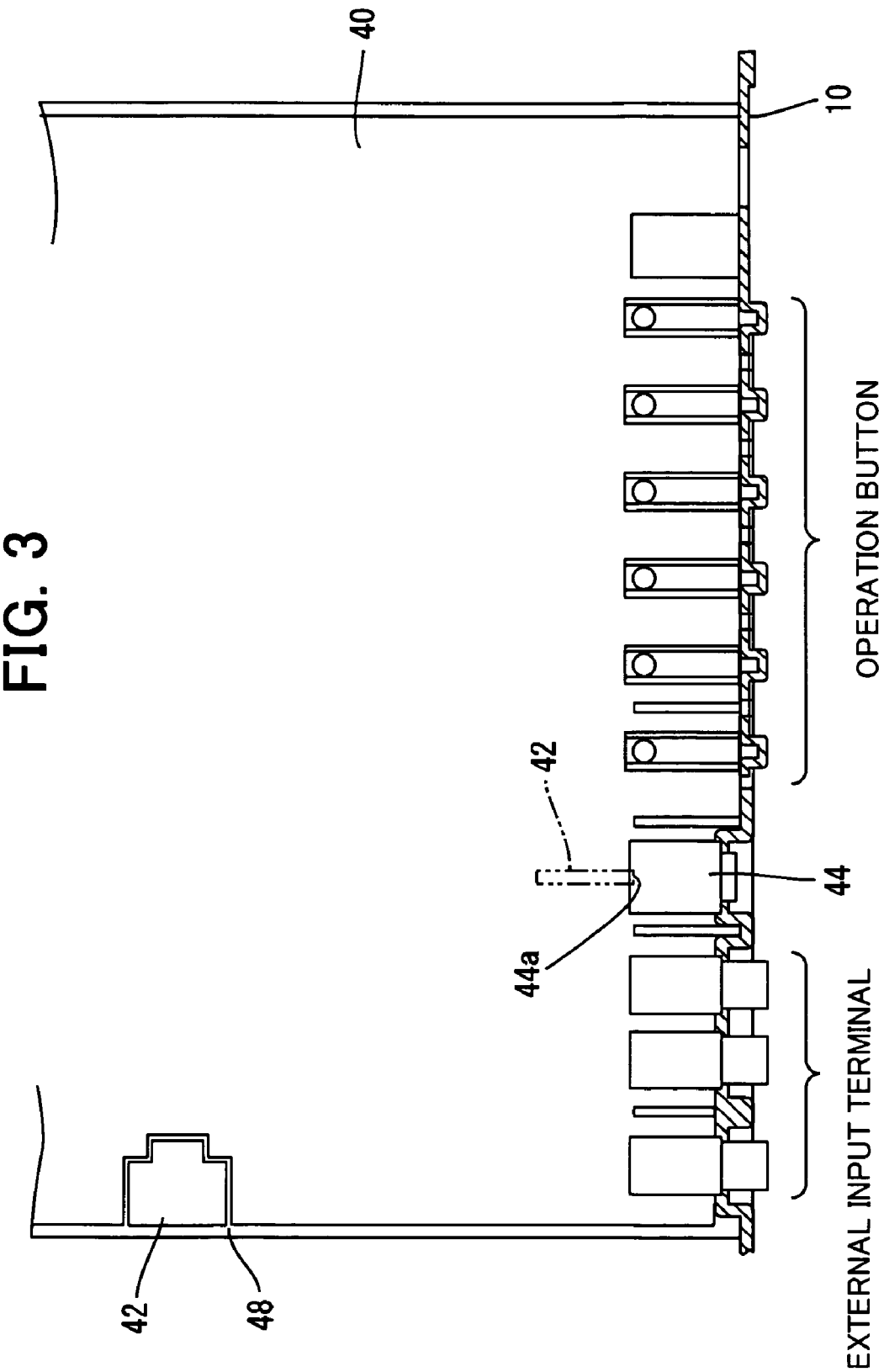
FIG. 3 is an exemplary illustration of a top view of the structure for fixing an earphone plug socket.
Figure 4:
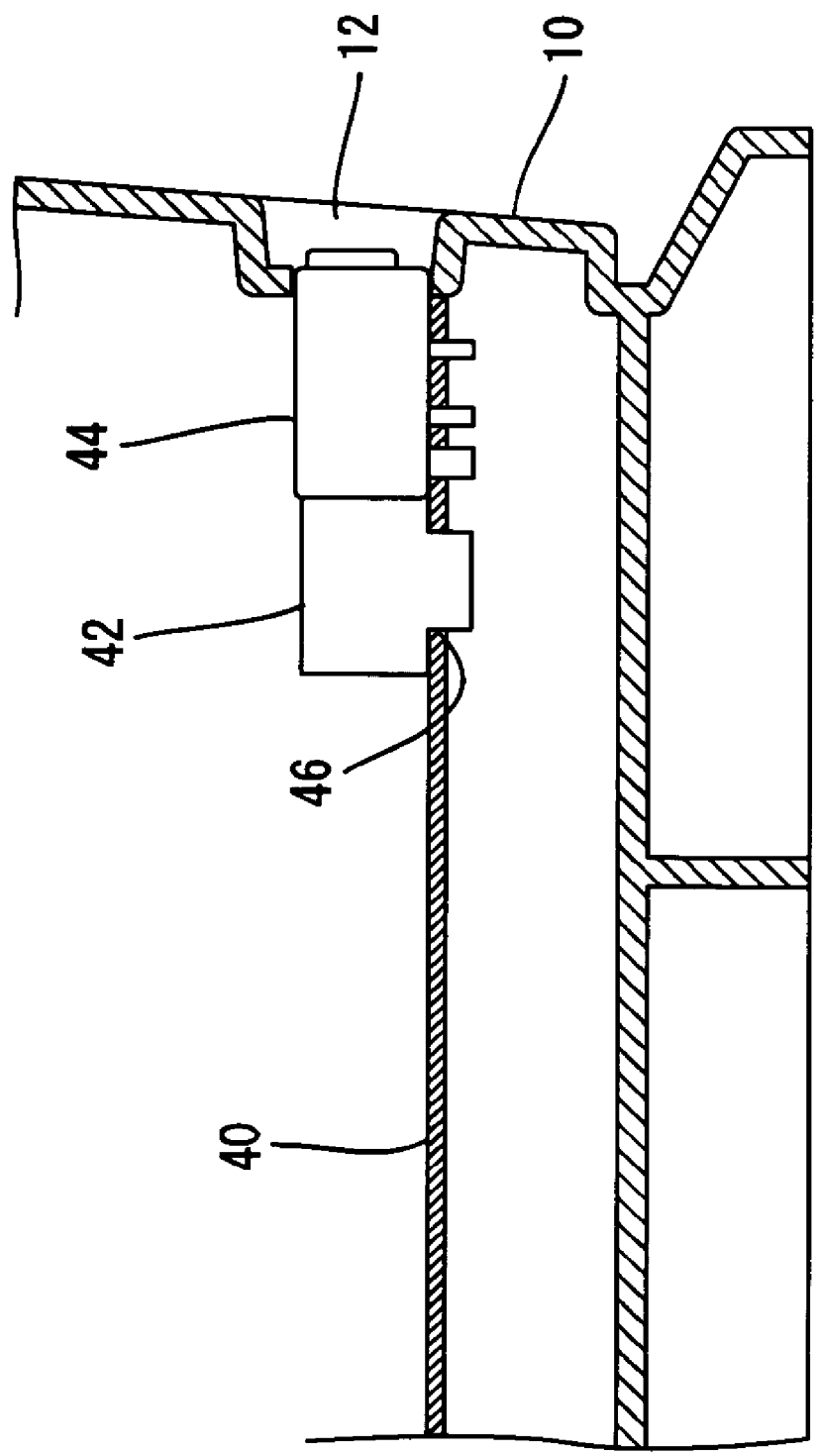
FIG. 4 is an exemplary illustration of a sectional view of the structure for fixing an earphone plug socket.

Further, although a television outputting a picture from a picture tube is described by way of example in the present embodiment, a liquid crystal television outputting a picture from a liquid crystal display panel, a plasma television outputting a picture from a plasma display panel and the like are also conceived as an image output apparatus according to the present invention (2) Construction of Structure for Fixing Earphone Plug Socket:

FIG. 2 is a schematic perspective view of a structure for fixing an earphone plug socket. FIG. 3 is a top view of the structure for fixing an earphone plug socket. FIG. 4 is a sectional view of the structure for fixing an earphone plug socket. The structure for fixing an earphone plug socket comprises the main board 40 and a retaining member 42.

Figure 5:
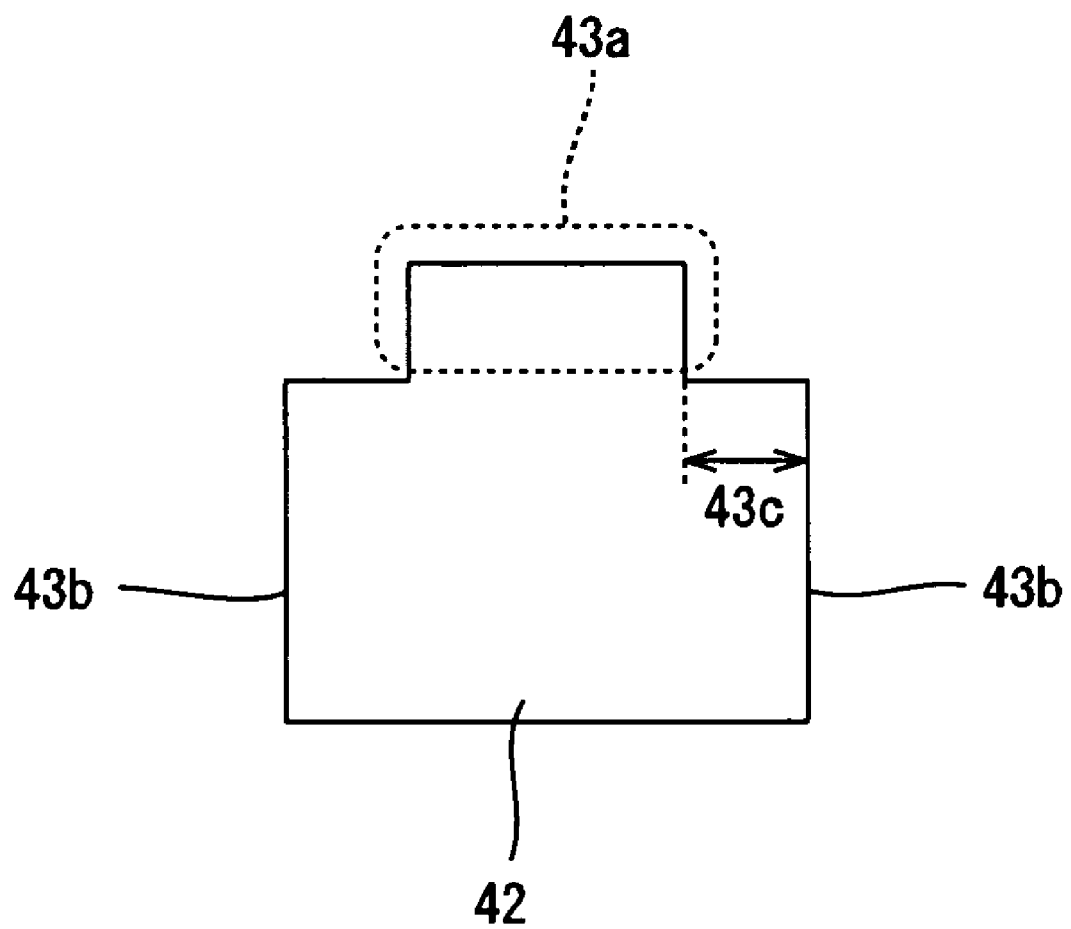
FIG. 5 is an exemplary illustration of a plan view of a retaining member.

On the contacting side of the main board 40 with the front cabinet 10, an earphone plug socket 44 is mounted in arrangement with an operation button such as a power switch, an external input terminal and the like. The earphone plug socket 44 is mounted so that the plug-in inlet 44b faces toward the front side of the television. Further, on the main board 40, a slit 46 is formed so as to locate the longer sides of the slit in line with the direction of the plug insertion at the predetermined distance from the back surface of the earphone plug socket 44. The predetermined distance, as shown in FIG. 5, is made equal to the length 43c from a projected part 43a to the side edge 43b of the retaining member 42.

In addition, when an outer shape and a pattern of the main board 40 are formed, a splitting slit 48 is formed, thereby allowing the retaining member 42 to be split up. The splitting slit 48 is also formed as a partial connection with the main board 40 left over so that the retaining member 42 can be supported with the main board 40 and split up after the forming of the board. Further, any location is allowed for the retaining member 42 and the splitting slit 48 to be formed, if it is at the area with no pattern formed on the main board 40.

The earphone plug socket 44 is approximately a rectangular solid and provided with the plug-in inlet 44b on the front surface thereof. The plug-in inlet 44b is outwardly exposed from the operation panel 12 of the front cabinet 10. Further, on the nearly central portion at the back surface of the earphone plug socket 44, a groove 44a is vertically formed, which is engaged with the side edge 43b of the retaining member 42 as mentioned below.

The retaining member 42 is of a letterpress shape and has the projected part 43a. The projected part 43a is fitted into the slit 46 which is formed in the back surface side of the earphone plug socket 44, thereby permitting the retaining member 42 to be erected almost uprightly with respect to the main board 40. In addition, the erection of the retaining member 42 at the slit 46 causes either of the side edges 43b to be engaged with the groove 44a formed on the back surface of the earphone plug socket 44 to support the earphone plug socket 44 at the back surface.

In addition, the width dimension of the projected part 43a of the retaining member 42 is formed to be a little longer than the length of the slit 46, which allows the retaining member 42 to be press-fitted into the slit 46. Further, the retaining member 42 and the slit 46 are secured together by dip soldering.

In addition, a hole for exposing the plug-in inlet 44b which is formed at the front cabinet 10 may be formed to be larger than the plug-in inlet 44b and smaller than the front outer shape of the earphone plug socket 44. This allows the front cabinet 10 to support the earphone plug socket 44 at the front surface thereof, so that the stress imposed on the earphone plug socket 44 can be reduced upon the users' pulling an earphone plug out of the plug-in inlet 44b. As a result, the earphone plug socket 44 can be reinforced and prevented from solder peeling or the like.

Figure 6:
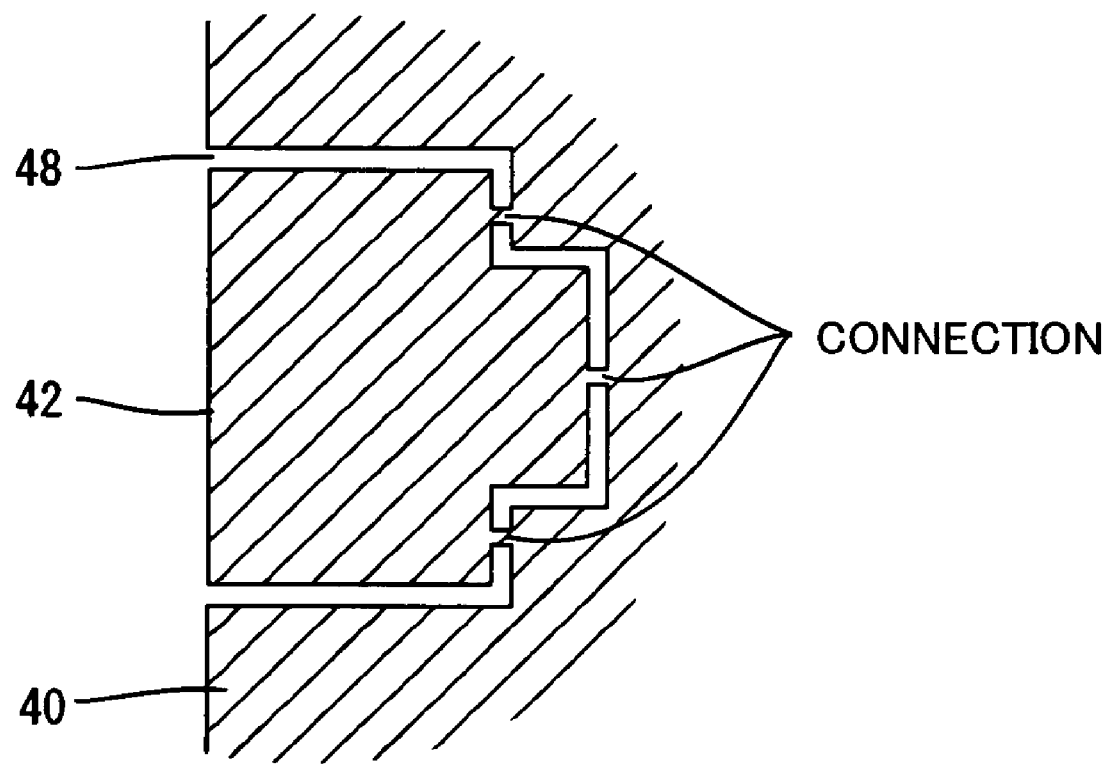
FIG. 6 is an exemplary illustration of a plan view of a connected portion between a main board and the retaining member.

Furthermore, the connections remaining in the splitting slit 48 between the retaining member 42 and the main board 40, as shown in FIG. 6, may be formed so as to avoid the portions to contact with the slit 46 and the back surface of the earphone plug socket 44 at the press-fitting. This makes it easy to press-fit the retaining member 42 into the slit 46 and support the earphone plug socket 44 by the nearly linear contact of the retaining member 42 with the back surface of the earphone plug socket 44 as well.

Also, when the front cabinet 10 is formed, the formation of each rib to contact with the upper surface and both sides of the right and left of the earphone plug socket 44 allows the earphone plug socket 44 to bear up against the stress imposed thereon in the lateral direction.

(3) Summary:

In brief, the formation of the retaining member 42 at the forming of the main board 40 so as to be able to be cut off and the cutting from the main board 40 after the board forming of the main board 40 causes the retaining member 42 to be separated in a letterpress shape from the main board 40. In addition, on the main board 40, the earphone plug socket 44 is mounted with the plug-in inlet 44b facing the outer periphery, the slit 46 is formed and the projected part 43a of the retaining member 42 is fitted into the slit 46 as well. In addition, the fitting of the retaining member 42 into the slit 46 causes the side edge 43b thereof to abut on the groove 44a at the back surface of the earphone plug socket 44.

It is needless to say that the present invention is not limited to the above-described embodiments. While it is needless to say to those skilled in the art, it is understood that the followings are disclosed as one embodiment according to the present invention:

to modify and apply properly combinations of the members, structures and the like disclosed in the above embodiments which can be mutually replaced;

to modify and apply combinations by properly replacing the members, structures and the like disclosed in the above embodiments with members, structures and the like which are not disclosed in the above embodiments but a known art and which can be mutually replaced; and to modify and apply combinations by properly replacing with the members, structures and the like which, although not disclosed in the above embodiments, those skilled in the art can conceive on the basis of a known art and the like as a substitute for the members, structures and the like disclosed in the above embodiments.

Although the invention has been described in considerable detail in language specific to structural features and or method acts, it is to be understood that the invention defined in the appended claims is not necessarily limited to the specific features or acts described. Rather, the specific features and acts are disclosed as preferred forms of implementing the claimed invention. Therefore, while exemplary illustrative embodiments of the invention have been described, numerous variations and alternative embodiments will occur to those skilled in the art. Such variations and alternate embodiments are contemplated, and can be made without departing from the spirit and scope of the invention.

What is claimed is:

1. A television, comprising:
   a cathode-ray tube displaying a visible image on the screen;
   a speaker outputting audio;
   an earphone plug socket outputting an audio signal;
   a main board that receives a television broadcasting to display the visible image on the cathode-ray tube and output the audio through the speaker with the earphone plug socket mounted on with the plug-in inlet facing the outer periphery; and
   a plastic cabinet that contains the cathode-ray tube, the speaker and the main board and on the front side of which a hole for exposing the plug-in inlet of the earphone plug socket;
   the main board, including:
   a retaining member of a T shape that is formed at marginal space on the main board where no wiring pattern is made and is formed by being cut off from the main board after the main board is formed;
   a slit where a projected part of the retaining member is inserted into and which is formed at the location where a side edge of an extending portion of the retaining member is to be adjacent to back of the earphone plug socket; and
   a groove that is longitudinally formed on the back surface of the earphone plug socket is engaged with the side edge;
   a length of the projected part is longer than a thickness of the main board and a width dimension is sufficiently long to press-fit into the slit;
   the hole is formed of larger dimension than the plug-in inlet and smaller than the outer shape of the earphone plug socket; and
   the projected part is press-fitted into the slit and fixed and secured by dip soldering.

2. A structure for fixing an earphone plug socket comprising:
   a board that the earphone plug socket is mounted with the plug-in inlet facing the outer periphery;
   a retaining member formed on a base material of the board and cut off from the board after the board is formed, separated in a T shape therefrom;

a slit formed on the board that the retaining member is fit into and fixed;
a projected part of the retaining member fit into the slit; and
a side edge of the retaining member abutting on a back surface of the earphone plug socket.

3. A structure for fixing an earphone plug socket according to claim 2, wherein the width dimension of the projected part is made long enough to be press-fitted into the slit.

4. A structure for fixing an earphone plug socket according to claim 2, wherein a groove engaged with the side edge is formed on the earphone plug socket.

5. A structure for fixing an earphone plug socket according to claim 2, wherein the projected part is secured on the board by dip soldering.

6. A structure for fixing an earphone plug socket according to claim 2, wherein a splitting slit is formed on the board at the forming of the board in order to split up the retaining member.

7. A structure for fixing an earphone plug socket according to claim 6, wherein a connection left over at the splitting slit between the retaining member and the board is not formed at the projected part and the side edges.

8. A television comprising:
an earphone plug socket;
a main board on which the earphone plug socket is mounted with a plug-in inlet facing an outer periphery; and
a plastic cabinet that has the main board and on a front side of which a hole for exposing the plug-in inlet of the earphone plug socket is formed;
a retaining member formed on a base material of the main board and cut off from the main board after the main board is formed, separating in a T shape therefrom;
a slit formed on the main board that the retaining member is fit into and fixed;
a projected part of the retaining member fit into the slit; and
a side edge of the retaining member abutting on the back surface of the earphone plug socket;
the hole has a larger dimension than the plug-in inlet and is smaller than the outer shape of the earphone plug socket.

* * * * *